US012641888B2

(12) United States Patent     (10) Patent No.:   US 12,641,888 B2

Cui et al.      (45) Date of Patent:    May 26, 2026

(54) ECO BASE CELL STRUCTURE, LAYOUT METHOD, AND SYSTEM

(71) Applicants: TAIWAN SEMICONDUCTOR MANUFACTURING COMPANY, LTD, Hsinchu (TW); TSMC NANJING COMPANY, LIMITED, Nanjing (CN)

(72) Inventors: Xin Jian Cui, Hsinchu (TW); Liu Han, Hsinchu (TW)

(73) Assignees: TAIWAN SEMICONDUCTOR MANUFACTURING COMPANY, LTD., Hsinchu (TW); TSMC NANJING COMPANY LIMITED, Nanjing (CN)

( * ) Notice: Subject to any disclaimer, the term of this patent is extended or adjusted under 35 U.S.C. 154(b) by 422 days.

(21) Appl. No.: 18/469,349

(22) Filed: Sep. 18, 2023

(65) Prior Publication Data

US 2025/0072117 A1     Feb. 27, 2025

(30) Foreign Application Priority Data

Aug. 25, 2023    (CN) ......................... 202311079068.9

(51) Int. Cl.
    *H10D 89/10*      (2025.01)
    *G06F 30/392*     (2020.01)
    *G06F 30/3953*    (2020.01)

(52) U.S. Cl.
    CPC ........... *H10D 89/10* (2025.01); *G06F 30/392* (2020.01); *G06F 30/3953* (2020.01)

(58) Field of Classification Search
CPC ... H10D 89/10; H01L 23/5386; G06F 30/392; G06F 30/3953; G06F 30/3947; G06F 30/394

See application file for complete search history.

(56) References Cited

U.S. PATENT DOCUMENTS

| | | |
|---|---|---|
| 7,137,094 B2 | 11/2006 | Tien |
| 7,458,051 B2 | 11/2008 | Hou et al. |
| 9,831,230 B2 | 11/2017 | Tien et al. |
| 10,339,250 B2 | 7/2019 | Tien et al. |
| 2008/0276100 A1 | 11/2008 | Varone et al. |
| | (Continued) | |

FOREIGN PATENT DOCUMENTS

| | | |
|---|---|---|
| DE | 10 2017 125 036 | 5/2018 |
| JP | 2000-133722 | 5/2000 |
| | (Continued) | |

*Primary Examiner* — Thanh Y. Tran
(74) *Attorney, Agent, or Firm* — Hauptman Ham LLP

(57) ABSTRACT

An IC structure includes first through third n-wells aligned along a first direction in a semiconductor substrate, wherein the first n-well is separated from each of the second and third n-wells by corresponding spaces, a first plurality of active areas, gate structures, and metal-like defined (MD) segments overlying and electrically connected to the active areas positioned in the first n-well, a first tap structure overlying and electrically connected to the second n-well, a second tap structure overlying and electrically connected to the third n-well, and a first metal segment extending in the first direction, overlying the first plurality of transistors, and electrically connected to each of the first and second tap structures.

20 Claims, 11 Drawing Sheets

(56)          References Cited

U.S. PATENT DOCUMENTS

| 2021/0199714 A1 | 7/2021 | Oberai et al. |
| 2022/0122961 A1* | 4/2022 | Pabba ................... H10D 89/10 |

FOREIGN PATENT DOCUMENTS

| KR | 20010001040 | 1/2001 |
| KR | 10-2022-0042987 | 4/2022 |
| KR | 20230115861 | 8/2023 |
| TW | 202201640 | 1/2022 |

* cited by examiner

900

902　Align first through third n-well regions in an IC layout diagram

904　Place a first ECO base cell in the first n-well region

906　Electrically connect the second and third n-well regions

908　Configure the ECO base cell as a functional cell

910　Store the IC layout diagram in a storage device

912　Perform a manufacturing operation based on the IC layout diagram

ECO BASE CELL STRUCTURE, LAYOUT METHOD, AND SYSTEM

BACKGROUND

The ongoing trend in miniaturizing integrated circuits (ICs) has resulted in progressively smaller devices which consume less power, yet provide more functionality at higher speeds than earlier technologies. Miniaturization has been achieved through design and manufacturing innovations tied to increasingly strict specifications. Various electronic design automation (EDA) tools are used to generate, revise, and verify designs for semiconductor devices while ensuring that design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
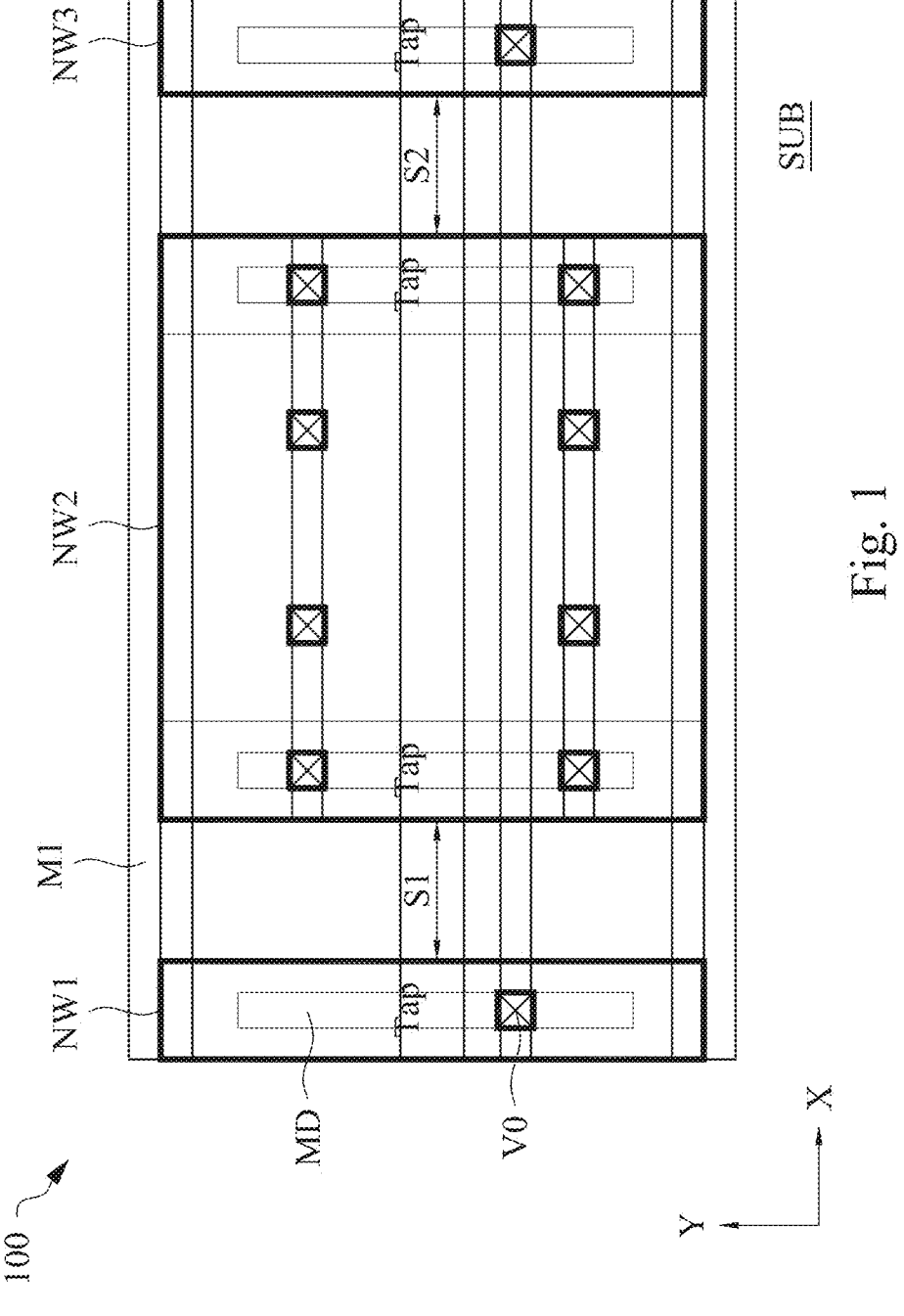
FIG. 1 is a diagram of an IC layout diagram and corresponding IC structure, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated.

For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an integrated circuit (IC) structure, layout diagram, and IC design system are directed to two types of standard cells, standard functional cells and standard spare cells, the latter being referred to as engineering change order (ECO) cells. Standard functional cells are defined with specific internal arrangements of components to provide (in operation) corresponding common, lower-level functions, e.g., logic functions including an inverter, NAND, NOR, XOR, D-latch, decoupling capacitor (DeCap), and-or-invert (AOI), or-and-invert (OAI), multiplexer, flip-flop, or the like.

ECO cells include ECO base cells and ECO programmed cells. An ECO programmed cell refers to an ECO base cell which has been programmed. Similar to a functional cell, an ECO base cell is defined with a specific internal arrangement of components. Unlike a functional cell, an ECO base cell is not arranged to provide a specific function. In contrast to standard cells which operate (are operational), an ECO base cell (which has not yet been programmed) does not operate (is not operational).

Recalling that ECO base cells are spare cells, the arrangement of an ECO base cell is sufficient that, if needed, the ECO base cell is able to be 'programed' (transformed) to operate and provide one of the same, common, low-level functions provided by a corresponding standard functional cell. In some embodiments, the arrangement of each ECO base cell is sufficient so that a given ECO base cell is able to be 'programed' (transformed) to operate and provide one of the logic functions including an inverter, NAND, NOR, XOR, D-latch, decoupling capacitor (DeCap), and-or-invert (AOI), or-and-invert (OAI), multiplexer, flip-flop, or the like. In some embodiments, an ECO base cell is programmed (transformed) into an ECO programmed cell by altering one or more connections within at least one ECO base cell (intra-ECO-base-cell connections) such as metal to silicon contacts and/or metal to polysilicon contacts, or making other metal layer changes with corresponding vias or contacts.

In some applications, electronic design automation (EDA) tools are used to select standard functional cells from standard cell libraries and place the standard functional cells into an initial layout along with non-standard cells (if any). EDA tools are also used to perform routing by which the standard functional cells and the non-standard cells are connected using one or more metal layers and corresponding vias and contacts. EDA tools are further used to test the routing. Depending upon the test results, the selection, placement and routing of the standard and non-standard cells is revised. In at least some embodiments, the overall selection, placement, routing and testing (SPRT) process is iterative. Eventually, the SPRT process iterations converge to a finalized layout.

For a variety of reasons (e.g., a design change, an unacceptable timing issue, an unacceptable electromigration issue, or the like), a nearly finalized layout (or a layout that otherwise would have been regarded as a final layout) might be required to undergo revision. In anticipation of circumstances in which the revision would be relatively minor in scope, and as a safeguard (or hedge) against having to restart (begin anew) the iterative SPRT process, EDA tools are also used to place one or more ECO base cells into the initial layout.

Because the ECO base cells do not operate, the ECO base cells are not connected to functional cells. When the nearly finalized layout is to be revised, one or more ECO base cells undergo 'programming,' which converts the one or more ECO base cells into one or more ECO 'programmed' cells. Then, the ECO programmed cell is routed to be operatively connected to one or more standard functional cells.

In the various embodiments discussed below, ECO base cells are capable of being placed in one n-well of multiple n-wells, whereby transistor bulk, or body, regions are capable of, in operation, being driven to voltage levels different from those of the bulk regions of transistors in neighboring n-wells, e.g., transistors included in standard functional cells or other ECO cells. Compared to approaches in which ECO base cells share n-wells with standard functional cells and other ECO cells, routing flexibility and design efficiency are thereby improved such that additional design activity, e.g., a SPRT process iteration or ECO cell customization, is able to be avoided.

Figure 9:
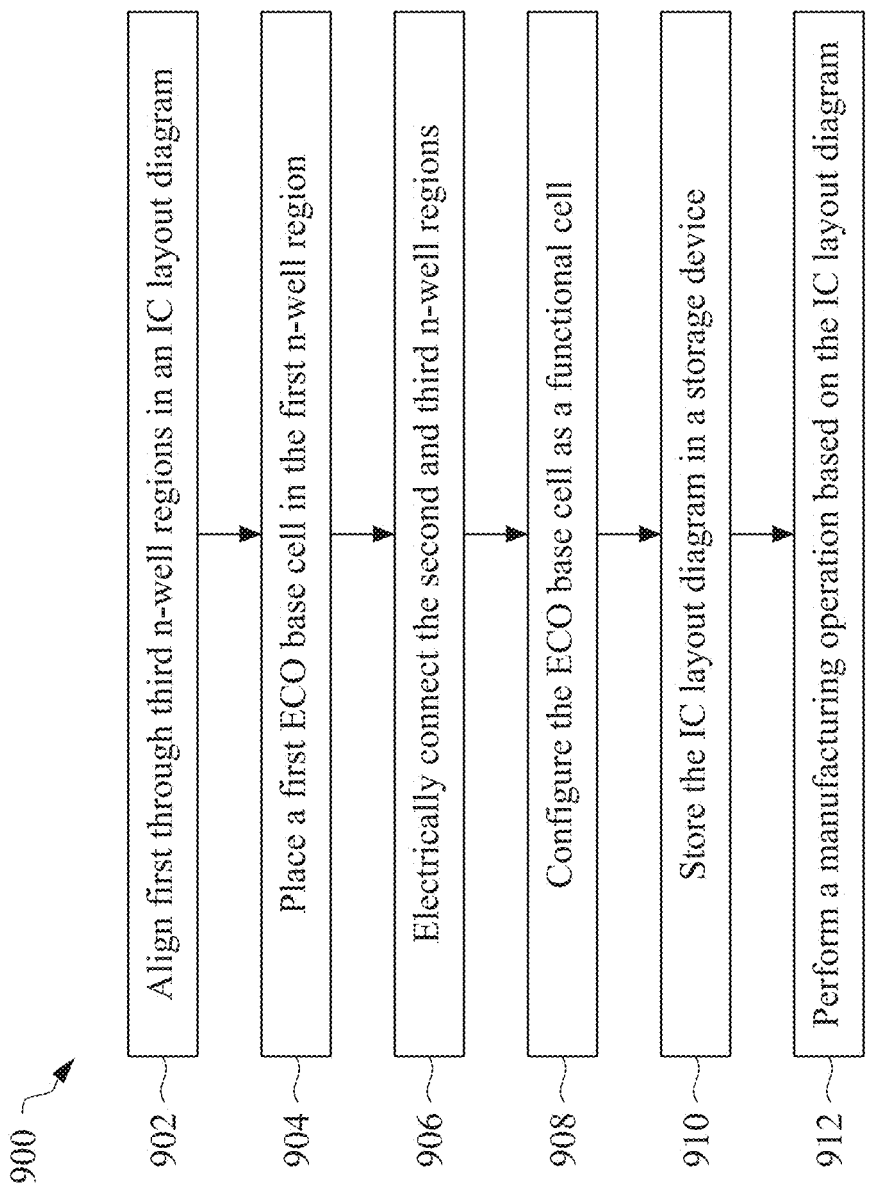
FIG. 9 is a flowchart of a method of generating an IC layout diagram, in accordance with some embodiments.
Figure 10:
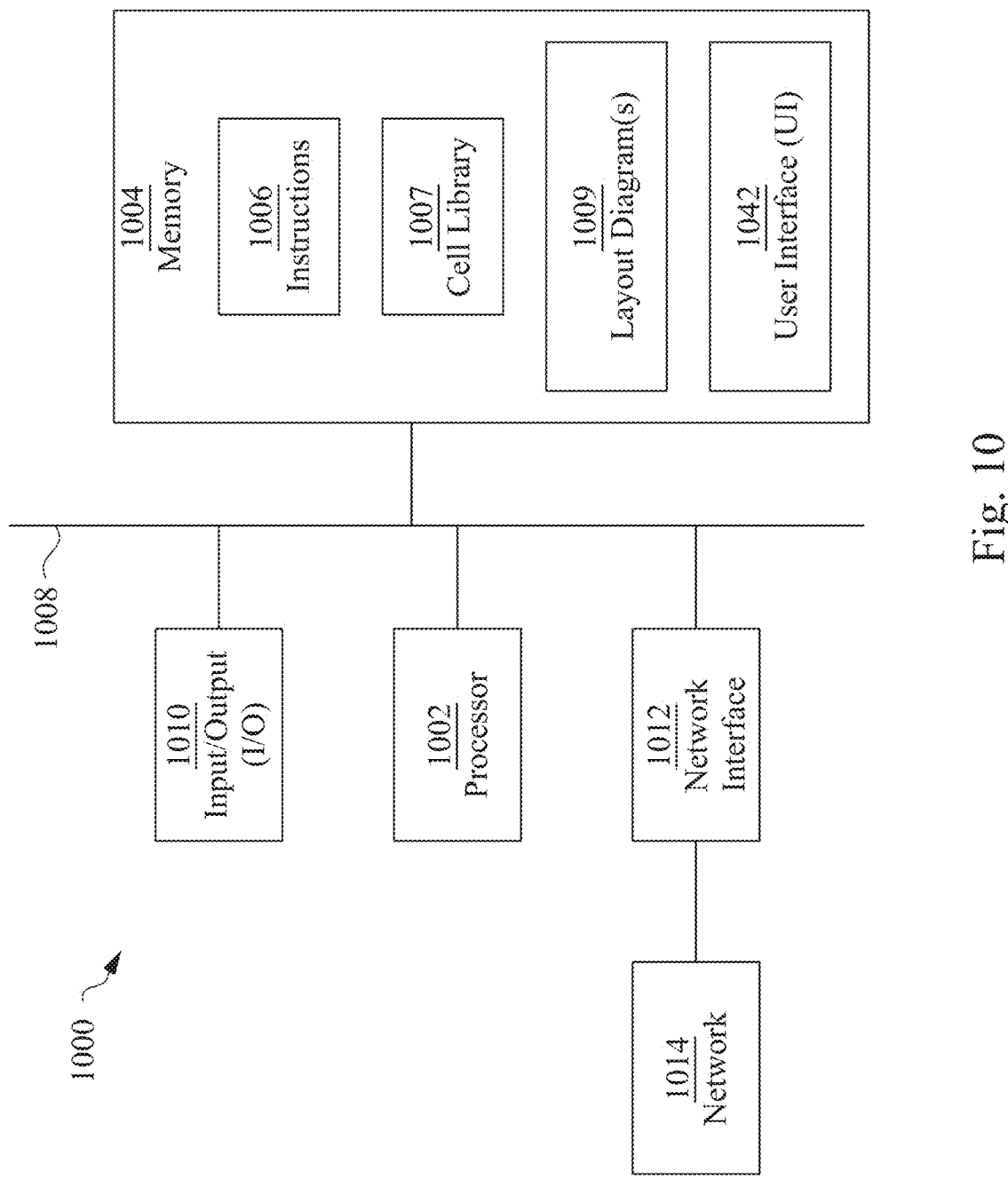
FIG. 10 is a block diagram of an IC design system, in accordance with some embodiments.

As discussed below, FIGS. 1-8 are diagrams of IC layout diagrams and corresponding IC structures, in accordance with some embodiments. The diagrams in FIGS. 1-8 represent both IC layout diagrams 100-800 and the corresponding IC structures 100-800 manufactured based at least in part on IC layout diagrams 100-800, e.g., in accordance with an IC manufacturing system and associated IC manufacturing flow 1100 discussed below with respect to FIG. 11. In accordance with some embodiments, FIG. 9 is a flowchart of a method 900 of generating an IC layout diagram, e.g., IC layout diagram 100-800, and FIG. 10 is a block diagram of an IC design system 1000, e.g., an EDA system 1000, configured to perform some or all of the operations of method 900.

As depicted in FIG. 1, IC layout diagram/structure 100 includes n-well regions/n-wells NW1-NW3 positioned in a substrate SUB, instances of metal-like defined (MD) regions/segments MD (a single one labeled for clarity) extending in a Y direction, instances of via regions/structures V0 (a single one labeled for clarity), and instances of first metal regions/segments M1 (a single one labeled for clarity) extending in an X direction perpendicular to the Y direction.

N-well regions/n-wells NW1-NW3 are regions in an IC layout diagram, e.g., IC layout diagram 100, that at least partially define n-doped volumes within substrate SUB in the manufacturing process corresponding to the IC layout diagram/structure.

N-well regions/n-wells NW1-NW3 are aligned along the X direction, n-well regions/n-wells NW1 and NW2 are separated in the X direction by a space S1, and n-well regions/n-wells NW2 and NW3 are separated in the X direction by a space S2.

Each of spaces S1 and S2 is a distance greater than or equal to a minimum spacing rule of the manufacturing process. In various embodiments, spaces S1 and S2 are equal to or different from each other.

In various embodiments, a space S1 or S2 corresponds to a portion of substrate SUB or to an isolation region/structure, e.g., a volume of a dielectric material, positioned between the corresponding n-well region/n-well pair NW1/NW2 and/or NW2/NW3.

Each of n-well regions/n-wells NW1-NW3 includes at least one instance of MD region MD, a region in the IC layout diagram that overlaps the corresponding n-well region NW1-NW3 and at least partially defines a conductive MD segment MD overlying and electrically connected to the underlying n-well NW1-NW3. An MD segment MD, also referred to as a metal-zero-over-oxide (MOOD) segment MD in some embodiments, is included in a lowest conductive, e.g., metal and/or highly doped semiconductor material, layer in the manufacturing process.

Each of n-well regions/n-wells NW1-NW3 also includes at least one instance of via region V0, a region in the IC layout diagram that overlaps a corresponding instance of MD region MD and at least partially defines a via structure V0 overlying and electrically connected to the corresponding underlying MD segment MD. A via structure V0 is a conductive volume configured to provide an electrical connection between the underlying feature, e.g., MD segment MD and an overlying feature, e.g., an instance of metal segment M1 discussed below.

As depicted in FIG. 1, combinations of instances of MD region/segment MD and via region/structure V0 in each of n-well regions/n-wells NW1-NW3 thereby correspond to tap features/structures Tap configured to at least partially define electrical connections between the underlying n-well region/n-well NW1-NW3 and overlying instances of metal region/segment M1.

A metal region M1 is a region in the IC layout diagram that overlaps one or more features including instances of via region V0 and at least partially defines a metal, e.g., copper, segment M1 overlying and electrically connected to the corresponding underlying instances of via structure V0. In some embodiments, a metal segment M1, also referred to as a metal-one segment M1 in some embodiments, is included in a lowest metal layer of a routing process, e.g., an automatic placement and routing (APR) process, corresponding to the IC layout diagram.

In the embodiment depicted in FIG. 1, n-well region NW2 includes a region Function positioned between two instances of tap feature Tap. The region Function is a region in the IC layout diagram, e.g., IC layout diagram 100, in which one or more instances of an ECO base cell ECO base is positioned, e.g., as discussed below with respect to FIGS. 2-8. The one or more instances of cell ECO base are capable of being programmed as one or more functional, e.g., logic, devices.

The region Function includes instances of via region/structure V0 corresponding to electrical connections between the one or more functional devices and overlapping/overlying instances of metal region/segment M1, each of which is electrically connected to the instances of tap feature/structure Tap positioned in n-well region/n-well NW2. The instances of metal region/segment M1 are thereby configured to be capable of driving n-well region/n-well NW2 and the one or more instances of cell ECO base (whether programmed or not) to a first voltage level, e.g., based on being routed through an overlying metal interconnect structure.

A separate instance of metal region/segment M1 overlaps/overlies the instances of tap feature/structure Tap positioned in each of n-well regions/n-wells NW1 and NW3, and overlaps/overlies the region Function, and is thereby configured to electrically connect n-well regions/n-wells NW1 and NW3 to each other while electrically isolating n-well region/n-well NW2 from n-well regions/n-wells NW1 and NW3. The instance of metal region/segment M1 is thereby configured to be capable of driving n-well regions/n-wells NW1 and NW3 and any corresponding functional circuits to a second voltage level different from the first voltage level, e.g., based on being routed through the overlying metal interconnect structure.

In the embodiment depicted in FIG. 1, IC layout diagram/structure 100 includes three additional instances of metal region/segment M1 wider in the Y direction than the other instances of metal region/segment M1. In various embodiments, the additional instances of metal region/segment M1 are included in a power distribution structure, e.g., a grid, configured to distribute a reference voltage level, e.g., ground, and one or more power supply voltage levels, e.g., VDD, within IC layout diagram/structure 100.

In the embodiment depicted in FIG. 1, the region Function extends in the Y direction a distance (height) equal to twice a pitch of the additional instances of metal region/segment M1. In various embodiments, the region Function extends the distance equal to the pitch or equal to pitch multiples greater than two.

In the embodiment depicted in FIG. 1, each of n-well regions/n-wells NW1-NW3 extends across an entirety of the region Function in the Y direction. In some embodiments, one or more of n-well regions/n-wells NW1-NW3 extends across a portion of the region Function, e.g., a distance equal to the pitch.

By the configuration discussed above, IC layout diagram/structure 100 is capable of including ECO base cells, e.g., cells ECO base discussed below, placed in n-well region/n-well NW2, whereby transistor bulk, or body, regions are capable of, in operation, being driven to voltage levels different from those of the bulk regions of transistors in neighboring n-well regions/n-wells, NW1 and NW3, e.g., transistors included in standard functional cells or other ECO cells. Compared to approaches in which ECO base cells share n-wells with standard functional cells and other ECO cells, routing flexibility and design efficiency are thereby improved such that additional design activity, e.g., a SPRT process iteration or ECO cell customization, is able to be avoided.

Figure 2:
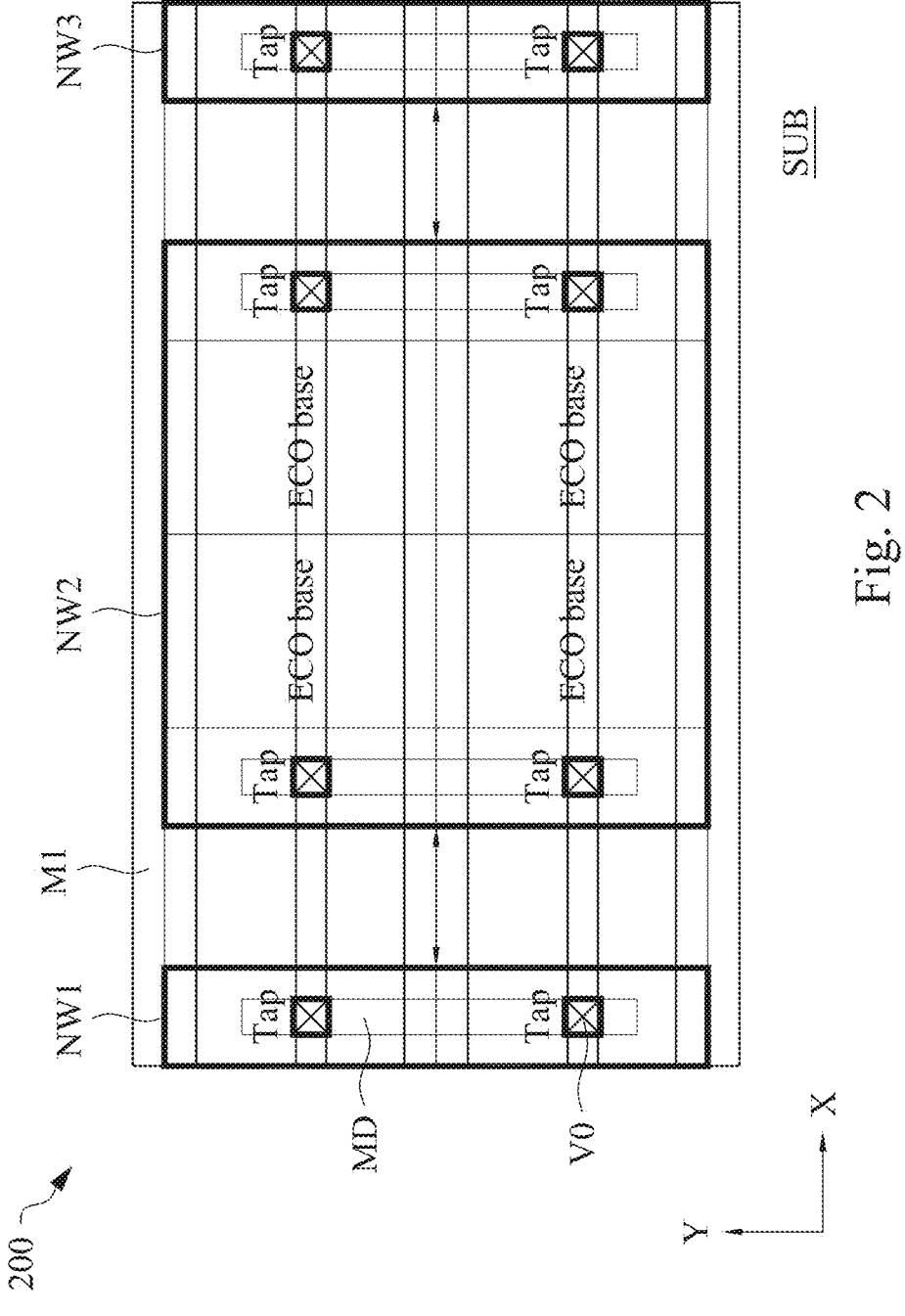
FIG. 2 is a diagram of an IC layout diagram and corresponding IC structure, in accordance with some embodiments.

FIG. 2 depicts IC layout diagram/structure 200 including n-well regions/n-wells NW1-NW3 positioned in substrate SUB, instances of MD regions/segments MD, via regions/structures V0, and first metal regions/segments M1, and the X and Y directions, each discussed above with respect to FIG. 1.

As illustrated in FIG. 2, a non-limiting example of the region Function (not labeled for the purpose of clarity) includes instances of cell ECO base arranged in two rows and two columns. In some embodiments, some or all of a row (indicated by the bold border) corresponds to a single instance of cell ECO base twice as wide in the X direction as the other instances of cell ECO base.

The arrangement of cell ECO base depicted in FIG. 2 is a non-limiting example provided for the purpose of illustration. In various embodiments, an IC layout diagram/ structure, e.g., IC layout diagram/structure 200, includes instances of cell ECO base having other configurations, e.g., some or all of a column corresponding to a single instance of cell ECO base twice as high in the Y direction as the other instances of cell ECO base.

In the embodiment depicted in FIG. 2, IC layout diagram/structure 200 includes instances of metal region/segment M1 extending in the X direction and overlapping/overlying the instances of tap feature/structure Tap positioned in each of n-well regions/n-wells NW1, NW2, and NW3, and is thereby configured to electrically connect n-well regions/n-wells NW1, NW2, and NW3 to each other. The instances of metal region/segment M1 are thereby configured to be capable of driving n-well regions/n-wells NW1, NW2, and NW3 and any corresponding ECO cells and/or functional circuits to a same voltage level, e.g., based on being routed through the overlying metal interconnect structure.

The embodiments depicted in FIGS. 1 and 2 thereby illustrate alternative routing options whereby one or more instances of cell ECO base placed in n-well region/n-well NW2 are capable of being driven to a voltage level either the same as or different from a voltage level applied to n-well regions/n-wells NW1 and NW3. In accordance with having this routing flexibility, each of FIGS. 3-8 discussed below does not depict instances of metal region/segment M1 having a specific configuration.

Figure 3:
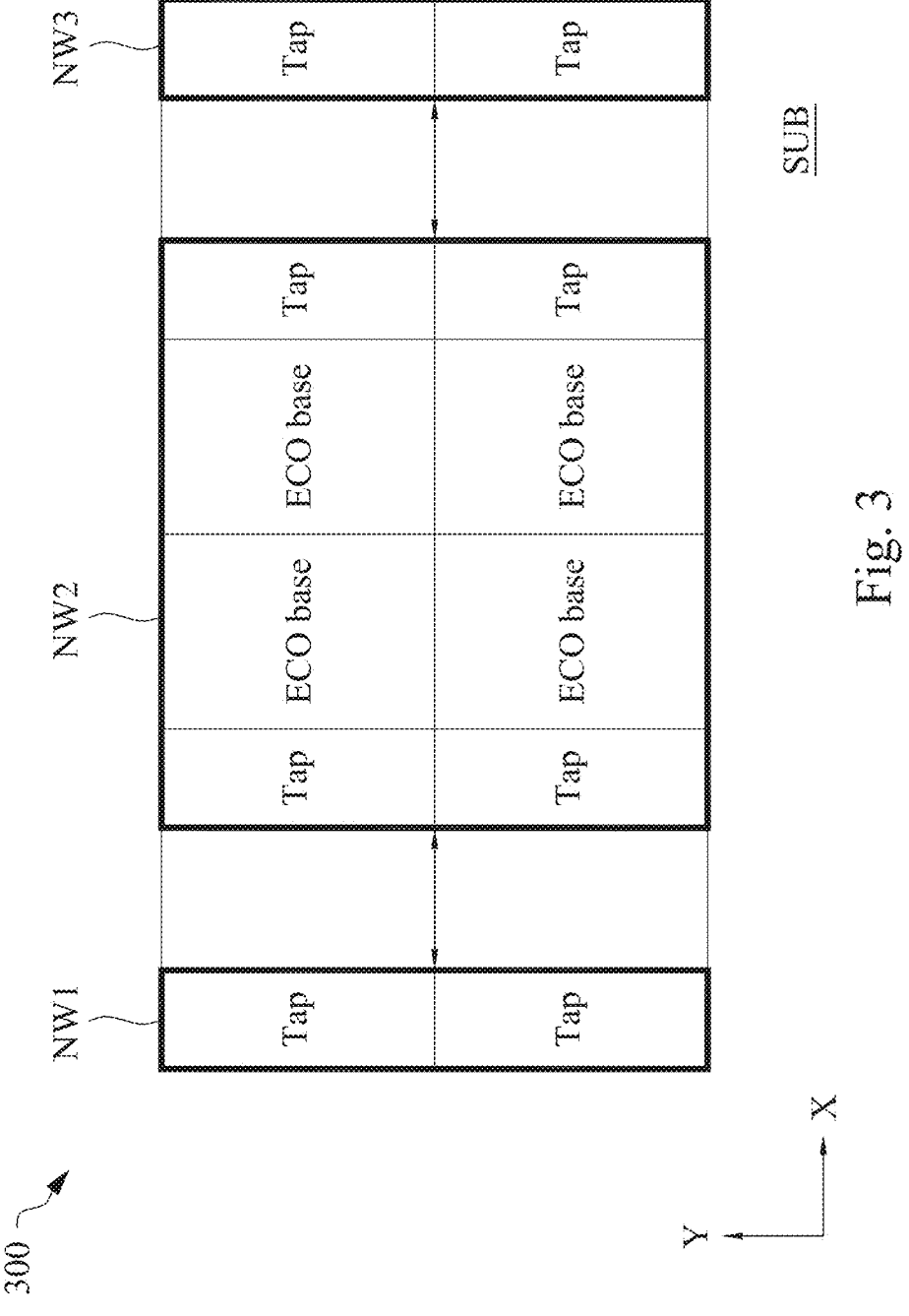
FIG. 3 is a diagram of an IC layout diagram and corresponding IC structure, in accordance with some embodiments.

FIG. 3 depicts a simplified view of IC layout diagram/structure 300 including n-well regions/n-wells NW1-NW3 positioned in substrate SUB, instances of tap feature/structure Tap and cell ECO base, and the X and Y directions, each discussed above.

FIG. 3 depicts a non-limiting example in which IC layout diagram/structure 300 includes four instances of cell ECO base arranged in two rows and two columns. In some embodiments, each instance of cell ECO base has a same orientation with respect to the X and Y directions. In some embodiments, one or more instances of cell ECO base are symmetrical to (mirrored with) one or more other instances of cell ECO base with respect to an X or Y axis, e.g., a border between one or more of the instances of cell ECO base, as further discussed below.

Figure 4:
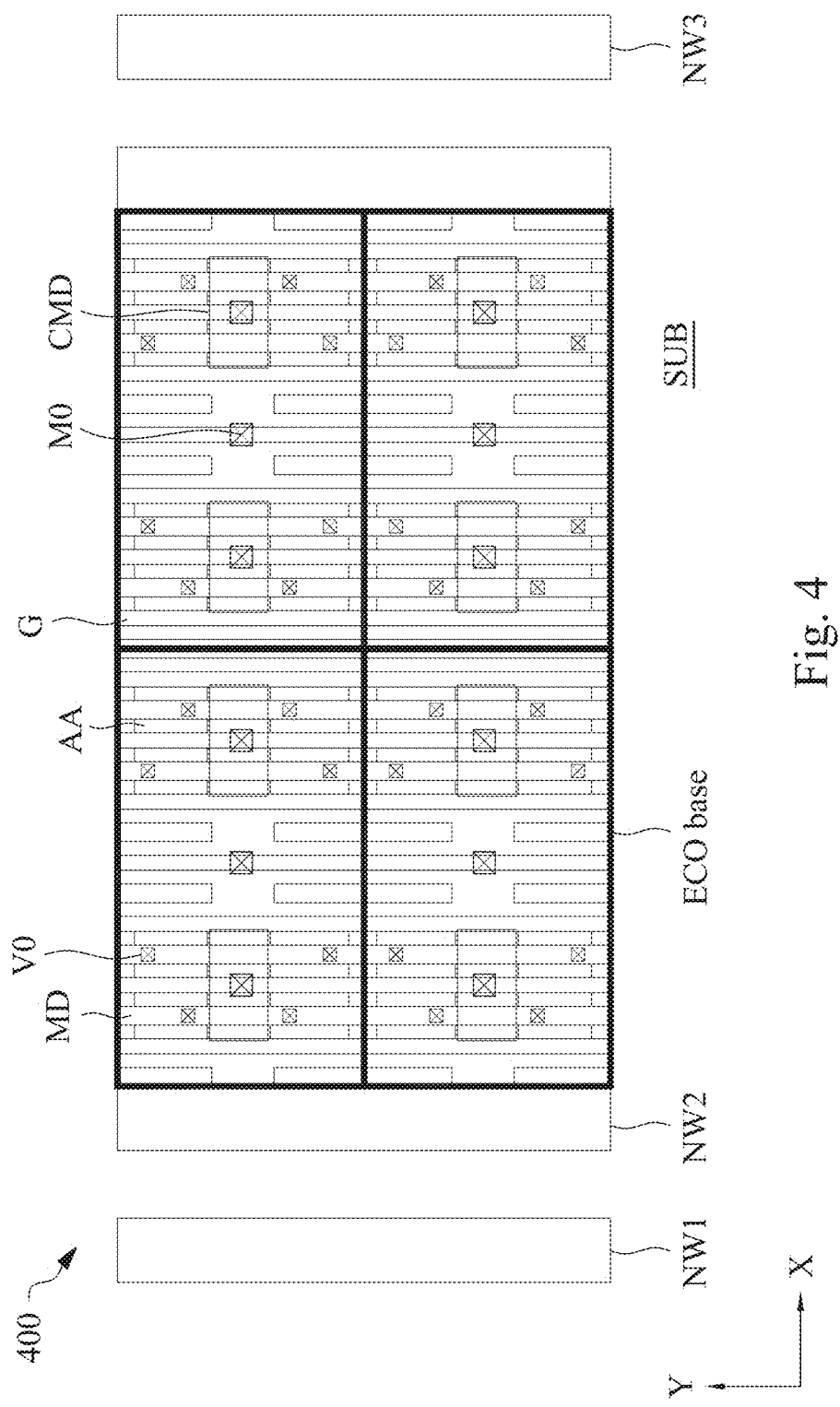
FIG. 4 is a diagram of an IC layout diagram and corresponding IC structure, in accordance with some embodiments.

FIG. 4 depicts a simplified view of IC layout diagram/structure 400 including n-well regions/n-wells NW1-NW3 positioned in substrate SUB, four instances of cell ECO base (a single instance labeled for the purpose of clarity), each including instances of MD region/segment MD and via region/structure V0, and the X and Y directions, each discussed above.

Each instance of cell ECO base also includes instances of an active region/area AA, a gate region/structure G, a metal-zero-over-poly (M0PO) region/segment M0, and cut-MD region CMD (a single instance of each labeled for the purpose of clarity).

An active region, e.g., active region AA, is a region in the IC layout diagram, e.g., a substrate region or n-well region, e.g., n-well region NW1-NW3, that at least partially defines a volume in the corresponding substrate or n-well in which various features, e.g., transistor channels and/or source/drain features are formed in the corresponding IC structure by the manufacturing process.

A gate region, e.g., gate region R, is a region in the IC layout diagram that at least partially defines a volume in the corresponding IC structure in which a gate electrode, also referred to as a poly gate or poly in some embodiments, and gate dielectric layer are formed by the manufacturing process.

A M0PO region, e.g., M0PO region M0, is a region in the IC layout diagram that at least partially defines a conductive segment, e.g., M0PO segment M0 overlying and electrically connected to an underlying gate structure. An M0PO segment M0 is included in the lowest conductive, e.g., metal and/or highly doped semiconductor material, layer in the manufacturing process.

A cut-MD region is a region in the IC layout diagram that defines an area in the corresponding IC structure within which portions of MD segments MD are removed after being formed in the manufacturing process, the resultant MD segments MD thereby being electrically isolated from each other.

The instances of active region/area AA, gate region/ structure G, M0PO region/segment M0, MD region/segment MD, via region/structure V0, and cut-MD region CMD in a given instance of cell ECO base are arranged in a pattern whereby the instance of cell ECO base is capable of being programmed to a selectable cell function.

In various embodiments, each instance of cell ECO base corresponds to a same pattern or a plurality of patterns. In some embodiments, two patterns are symmetrical with each other about an axis, e.g., a border between the two patterns.

In some embodiments, the instances of cell ECO base depicted in FIG. 4 correspond to a first row in which a second pattern is symmetrical to a first pattern about a border extending in the Y direction, and a second row in which third and fourth patterns are symmetrical to the first and second patterns about a border extending in the X direction.

Figure 5:
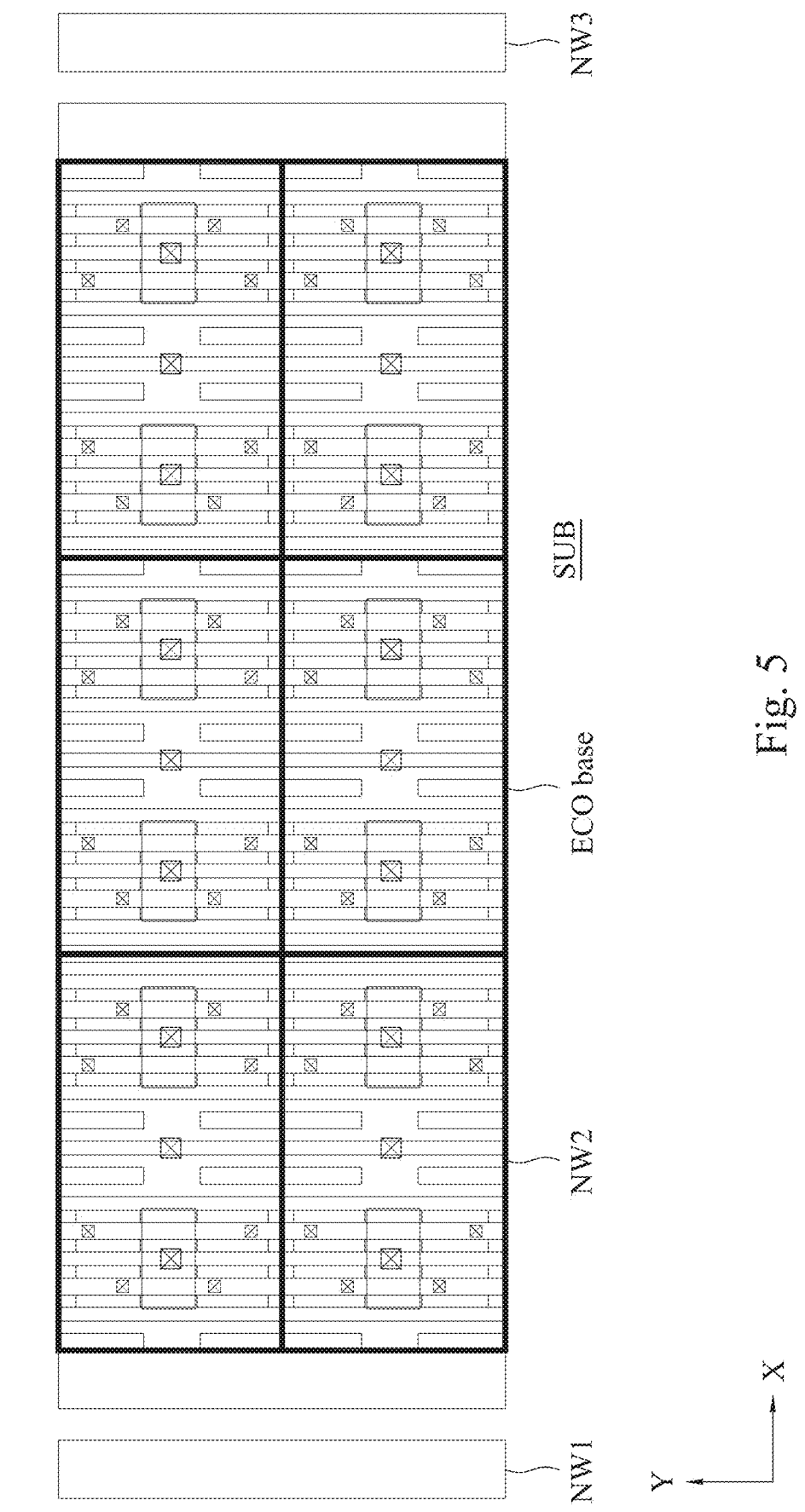
FIG. 5 is a diagram of an IC layout diagram and corresponding IC structure, in accordance with some embodiments.
Figure 6:
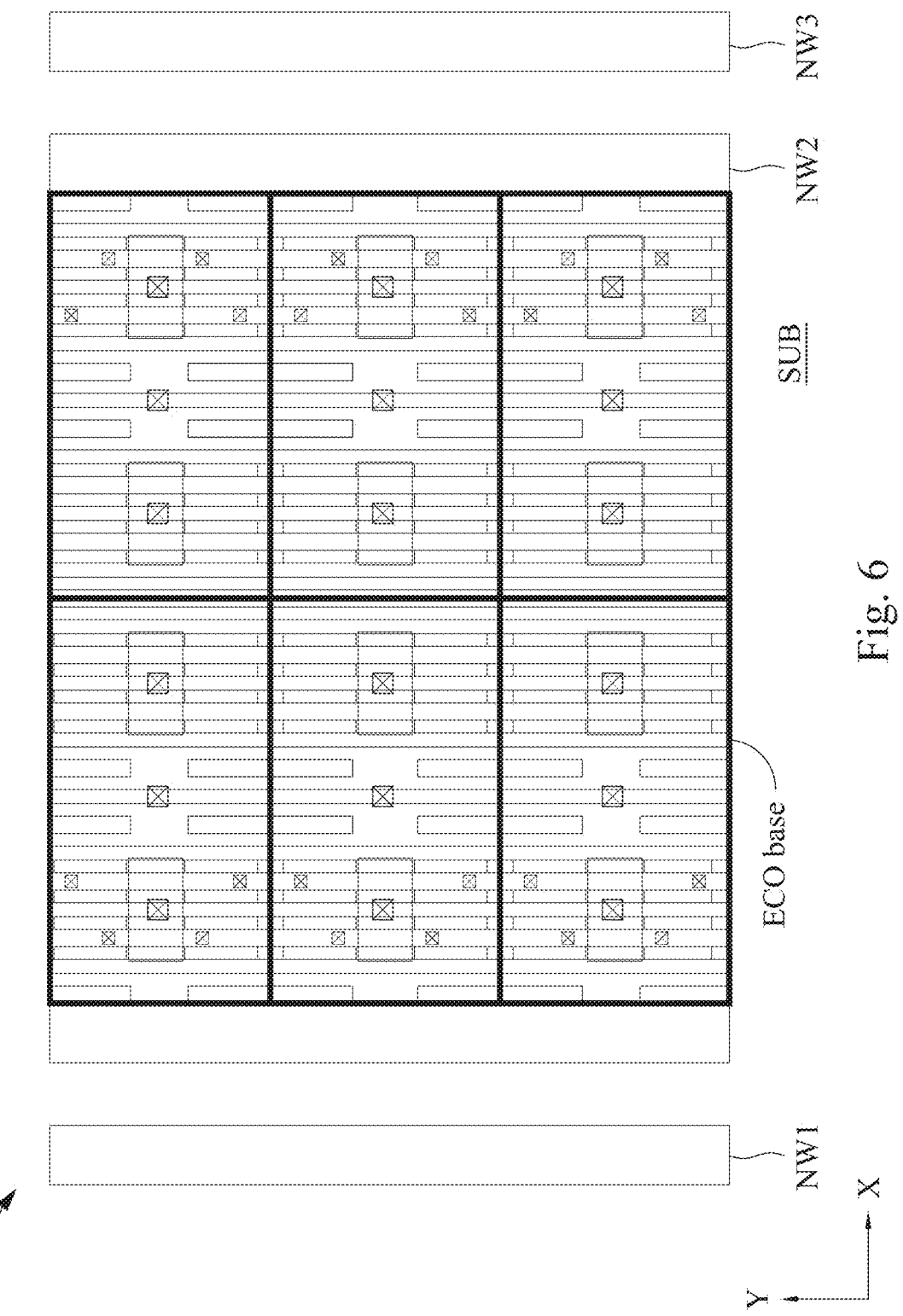
FIG. 6 is a diagram of an IC layout diagram and corresponding IC structure, in accordance with some embodiments.

Each of FIGS. 5 and 6 depicts a simplified view of corresponding IC layout diagram/structure 500 or 600 including n-well regions/n-wells NW1-NW3 positioned in substrate SUB, six instances of cell ECO base (a single instance labeled for the purpose of clarity), each including instances of active region/area AA, gate region/structure G, M0PO region/segment M0, MD region/segment MD, via region/structure V0, and cut-MD region CMD (not labeled for the purpose of clarity), and the X and Y directions, each discussed above.

In various embodiments, the instances of cell ECO base included in IC layout diagrams/structures 500 and 600 include the corresponding instances of active region/area AA, gate region/structure G, M0PO region/segment M0, MD region/segment MD, via region/structure V0, and cut-MD region CMD arranged in one or more patterns, in some embodiments having symmetry corresponding to one or more axes.

Figure 7:
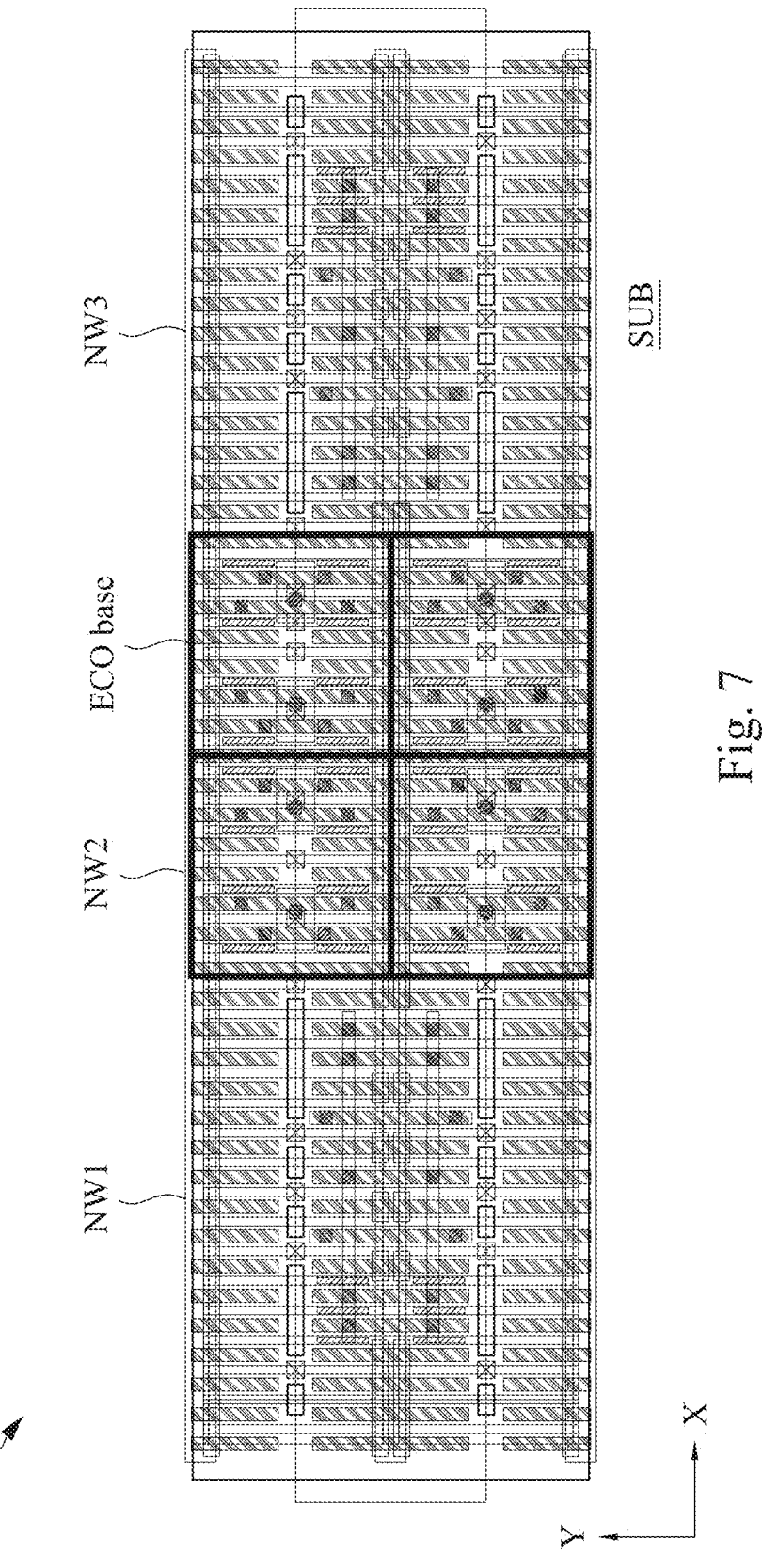
FIG. 7 is a diagram of an IC layout diagram and corresponding IC structure, in accordance with some embodiments.
Figure 8:
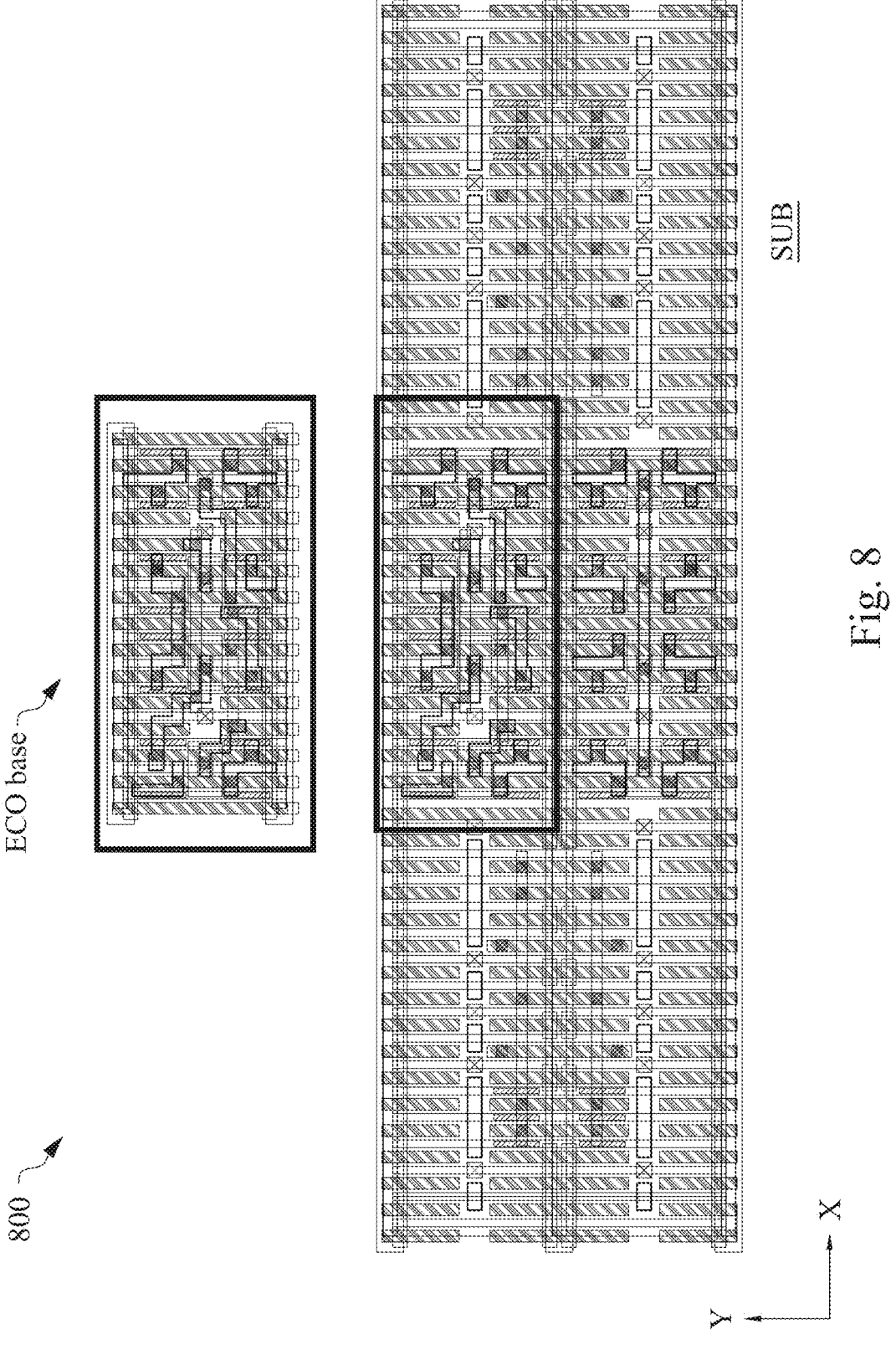
FIG. 8 is a diagram of an IC layout diagram and corresponding IC structure, in accordance with some embodiments.

Each of FIGS. 7 and 8 depicts a simplified view of corresponding IC layout diagram/structure 700 or 800 including n-well regions/n-wells NW1-NW3 positioned in substrate SUB, and instances of cell ECO base including various features (not labeled for the purpose of clarity).

The non-limiting example depicted in FIG. 7 includes four instances of cell ECO base positioned in n-well region/ n-well NW2, and the non-limiting example depicted in FIG. 8 includes a single instance of cell ECO base positioned in n-well region/n-well NW2, the single instance being con- figured as a decoupling capacitive device DCAP2.

By including the various instances of cell ECO base in n-well region/n-well NW2, each of IC layout diagrams/ structures 300-800 is configured in accordance with IC layout diagrams/structures 100 and 200 and is thereby capable of realizing the benefits discussed above with respect to IC layout diagrams/structures 100 and 200.

FIG. 9 is a flowchart of method 900 of generating an IC layout diagram, in accordance with some embodiments. In some embodiments, generating the IC layout diagram includes generating some or all of one or more of IC layout diagrams 100-800 discussed above with respect to FIGS. 1-8.

In some embodiments, some or all of method 900 is executed by a processor of a computer. In some embodi- ments, some or all of method 900 is executed by a processor 1002 of IC layout diagram generation system 1000, dis- cussed below with respect to FIG. 10.

In some embodiments, one or more operations of method 900 are a subset of operations of a method of forming an IC device. In some embodiments, one or more operations of method 900 are a subset of operations of an IC manufac- turing flow, e.g., the IC manufacturing flow discussed below with respect to manufacturing system 1100 and FIG. 11.

In some embodiments, the operations of method 900 are performed in the order depicted in FIG. 9. In some embodi- ments, the operations of method 900 are performed simul- taneously and/or in an order other than the order depicted in FIG. 9. In some embodiments, one or more operations are performed before, between, during, and/or after performing one or more operations of method 900.

At operation 902, first through third n-well regions are aligned along a first direction in an IC layout diagram. Aligning the first through third n-well regions includes the first n-well region being separated from each of the second and third n-well regions by at least a distance corresponding to a minimum n-well spacing rule.

In some embodiments, aligning the first through third n-well regions includes aligning n-well regions NW2, NW1, and NW3, n-well region NW2 being separated from n-well region NW1 by space S1 and n-well region NW2 being separated from n-well region NW3 by space S2 in accor- dance with one or more of IC layout diagrams 100-800 discussed above with respect to FIGS. 1-8.

In some embodiments, aligning the first through third n-well regions includes positioning a first tap via region in the second n-well region and positioning a second tap via region in the third n-well region. In some embodiments, aligning the first through third n-well regions includes positioning third and fourth tap via regions in the first n-well region.

In some embodiments, positioning a tap via region includes positioning an instance of tap feature Tap including an instance of via region V0 overlapping a corresponding instance of MD region MD discussed above with respect to FIGS. 1 and 2.

At operation 904, a first ECO base cell is placed in the first n-well region. In some embodiments, placing the first ECO base cell in the first n-well region includes placing cell ECO base in n-well region NW2 discussed above with respect to FIGS. 1-8.

In some embodiments, placing the first ECO base cell in the first n-well region includes placing a plurality of ECO base cells including the first ECO base cell in the first n-well region, e.g., instances of cell ECO base in n-well region NW2 in accordance with one or more of FIGS. 2-8.

At operation 906, the second and third n-well regions are electrically connected. Electrically connecting the second and third n-well regions includes establishing a first electri- cal connection between the second and third n-well regions by overlapping each of the first and second tap via regions with a first metal region extending across the first n-well region in the first direction.

In some embodiments, overlapping each of the first and second tap via regions with the first metal region extending across the first n-well region in the first direction includes overlapping the instances of tap feature Tap corresponding to n-well regions NW1 and NW3 with an instance of metal region M1 extending across n-well region NW2 in the X direction as discussed above with respect to FIGS. 1 and 2.

In some embodiments, electrically connecting the second and third n-well regions includes establishing a second electrical connection between the third and fourth tap via regions by overlapping each of the third and fourth tap via regions with a second metal region extending across the first ECO base cell in the first direction, e.g., as discussed above with respect to FIG. 1.

In some embodiments, electrically connecting the second and third n-well regions includes overlapping each of the third and fourth tap via regions with the first metal region, thereby establishing the first electrical connection between each of the second and third n-well regions and the first n-well region, e.g., as discussed above with respect to FIG. 2.

At operation 908, in some embodiments, the ECO base cell is configured as a functional cell. In some embodiments, configuring the ECO base cell as a functional cell includes adding and/or modifying one or more electrical connections within the functional cell, thereby configuring the ECO base cell to perform one or more logic or other functions.

In various embodiments, configuring the ECO base cell as a functional cell includes configuring a subset or all of a plurality of ECO base cells as corresponding functional cells. In some embodiments, configuring the ECO base cell as a functional cell includes configuring one or more instances of cell ECO base discussed above with respect to FIGS. 1-8.

In some embodiments, configuring the ECO base cell as a functional cell includes performing one or more routing operations, e.g., one or more APR operations. In some embodiments, configuring the ECO base cell as a functional cell includes routing a plurality of electrical signal paths to the functional cell.

In some embodiments, configuring the ECO base cell as a functional cell includes routing a first voltage distribution path to the first electrical connection, e.g., configured to distribute a first voltage level.

In some embodiments, configuring the ECO base cell as a functional cell includes routing a second voltage distribution path to the second electrical connection, e.g., configured to distribute a second voltage level different from the first voltage level.

At operation 910, in some embodiments, the IC layout diagram is stored in a storage device. In some embodiments, storing the IC layout diagram in the storage device includes storing the IC layout diagram in an IC layout diagram library, e.g., layout diagram library 1009 of IC layout diagram generation system 1000, discussed below with respect to FIG. 10.

In some embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram over network 1014 of IC layout diagram generation system 1000, discussed below with respect to FIG. 10.

At operation 912, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 11.

By executing some or all of the operations of method 900, an IC layout diagram is generated in which one or more instances of an ECO base cell are placed in a dedicated n-well region configured in accordance with IC layout diagrams 100 and 200, and is thereby capable of realizing the benefits discussed above with respect to IC layout diagrams/structures 100 and 200.

FIG. 10 is a block diagram of an electronic design automation (EDA) system 1000 in accordance with some embodiments.

In some embodiments, EDA system 1000 includes an APR system. Methods described herein of designing layout diagrams represent wire routing arrangements, in accordance with one or more embodiments, are implementable, for example, using EDA system 1000, in accordance with some embodiments.

In some embodiments, EDA system 1000 is a general purpose computing device including a hardware processor 1002 and a non-transitory, computer-readable storage medium 1004. Storage medium 1004, amongst other things, is encoded with, i.e., stores, computer program code 1006, i.e., a set of executable instructions. Execution of instructions 1006 by hardware processor 1002 represents (at least in part) an EDA tool which implements a portion or all of the methods described herein in accordance with one or more embodiments (hereinafter, the noted processes and/or methods).

Processor 1002 is electrically coupled to computer-readable storage medium 1004 via a bus 1008. Processor 1002 is also electrically coupled to an I/O interface 1010 by bus 1008. A network interface 1012 is also electrically connected to processor 1002 via bus 1008. Network interface 1012 is connected to a network 1014, so that processor 1002 and computer-readable storage medium 1004 are capable of connecting to external elements via network 1014. Processor 1002 is configured to execute computer program code 1006 encoded in computer-readable storage medium 1004 in order to cause system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, storage medium 1004 stores computer program code 1006 configured to cause system 1000 (where such execution represents (at least in part) the EDA tool) to be usable for performing a portion or all of the noted processes and/or methods. In one or more embodiments, storage medium 1004 also stores information which facilitates performing a portion or all of the noted processes and/or methods. In one or more embodiments, storage medium 1004 stores cell library 1007 of IC layout cells including such cells as disclosed herein. In one or more embodiments, storage medium 1004 stores one or more layout diagrams 1009 corresponding to one or more layouts disclosed herein.

EDA system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

EDA system 1000 also includes network interface 1012 coupled to processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1000.

System 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. EDA system 1000 is configured to receive information related to a user interface (UI) through I/O interface 1010. The information is stored in computer-readable medium 1004 as UI 1042.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
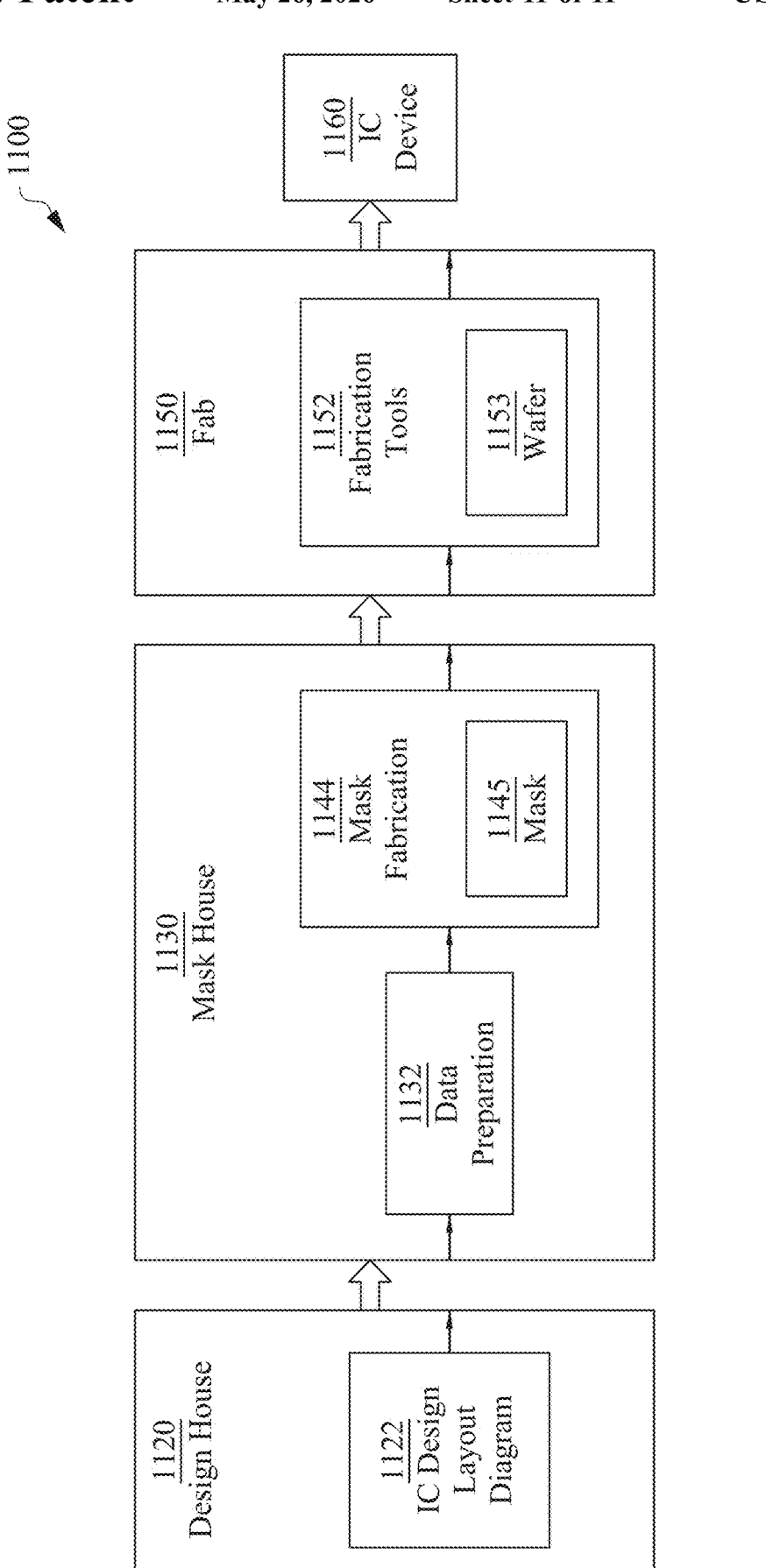
FIG. 11 is a block diagram of an integrated circuit (IC) manufacturing system, and an IC manufacturing flow associated therewith, in accordance with some embodiments.

FIG. 11 is a block diagram of an integrated circuit (IC) manufacturing system 1100, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1100.

In FIG. 11, IC manufacturing system 1100 includes entities, such as a design house 1120, a mask house 1130, and an IC manufacturer/fabricator (fab) 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file (RDF). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, subresolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for photolithographic implementation effects during mask fabrication 1144, which may undo part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1150 includes fabrication tools 1152 configured to execute various manufacturing operations on semiconductor wafer 1153 such that IC device 1160 is fabricated in accordance with the mask(s), e.g., mask 1145. In various embodiments, fabrication tools 1152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multi-level interconnects, and the like (formed at subsequent manufacturing steps).

In some embodiments, an IC structure includes first through third n-wells aligned along a first direction in a semiconductor substrate, wherein the first n-well is separated from each of the second and third n-wells by corresponding spaces, a first plurality of active areas, gate structures, and MD segments overlying and electrically connected to the active areas positioned in the first n-well, a first tap structure overlying and electrically connected to the second n-well, a second tap structure overlying and electrically connected to the third n-well, and a first metal segment extending in the first direction, overlying the first plurality of transistors, and electrically connected to each of the first and second tap structures. In some embodiments, the IC structure includes third and fourth tap structures overlying and electrically connected to the first n-well and a second metal segment extending in the first direction, wherein the second metal segment overlies and is electrically connected to each of the third and fourth tap structures and is electrically isolated from the first metal segment. In some embodiments, the first metal segment is configured to have a first voltage level and the second metal segment is configured to have a second voltage level different from the first voltage level. In some embodiments, the IC structure includes third and fourth tap structures overlying and electrically connected to the first n-well, wherein the first metal segment is electrically connected to each of the third and fourth tap structures. In some embodiments, the first plurality of active areas, gate structures, and MD segments includes a first pattern, and the IC structure includes a second plurality of active areas, gate structures, and MD segments overlying and electrically connected to the active areas positioned in the first n-well and including the first pattern. In some embodiments, the first plurality of active areas, gate structures, and MD segments includes a first pattern, the IC structure includes a second plurality of active areas, gate structures, and MD segments overlying and electrically connected to the active areas positioned in the first n-well and including a second pattern, and the second pattern is symmetrical to the first pattern about a first axis perpendicular to the first direction. In some embodiments, the IC structure includes third and fourth pluralities of active areas, gate structures, and MD segments overlying and electrically connected to the active areas positioned in the first n-well and including respective third and fourth patterns, wherein the third and fourth patterns are symmetrical to the first and second patterns about a second axis along the first direction.

In some embodiments, a method of generating an IC layout diagram includes aligning first through third n-well regions along a first direction in the IC layout diagram, wherein the first n-well region is separated from each of the second and third n-well regions by at least a distance corresponding to a minimum n-well spacing rule, positioning a first tap via region in the second n-well region, positioning a second tap via region in the third n-well region, placing a first ECO base cell in the first n-well region, establishing a first electrical connection between the second and third n-well regions by overlapping each of the first and second tap via regions with a first metal region extending across the first n-well region in the first direction, and storing the IC layout diagram in a storage device. In some embodiments, the method includes positioning third and fourth tap via regions in the first n-well region and establishing a second electrical connection between the third and fourth tap via regions by overlapping each of the third and fourth tap via regions with a second metal region extending across the first ECO base cell in the first direction. In some embodiments, the method includes routing a first voltage distribution path to the first electrical connection and routing a second voltage distribution path to the second electrical connection, wherein the first and second voltage distribution paths are configured to distribute separate voltage levels. In some embodiments, the method includes positioning third and fourth tap via regions in the first n-well region, wherein establishing the first electrical connection includes overlapping each of the third and fourth tap via regions with the first metal region, thereby establishing the first electrical connection between each of the second and third n-well regions and the first n-well region. In some embodiments, placing the first ECO base cell in the first n-well region includes placing a second ECO base cell in the first n-well region adjacent to the first ECO base cell in the first direction. In some embodiments, placing the first ECO base cell in the first n-well region includes placing a second ECO base cell in the first n-well region adjacent to the first ECO base cell in the first direction, the first and second ECO base cells being symmetrical about a border between the first and second ECO base cells, and placing third and fourth ECO base cells in the first n-well region adjacent to the first and second ECO base cells in a second direction perpendicular to the first direction, the first and third ECO base cells being symmetrical about a border between the first and third ECO base cells, and the second and fourth ECO base cells being symmetrical about a border between the second and fourth ECO base cells. In some embodiments, placing the first ECO base cell in the first n-well region includes placing second and third ECO base cells in the first n-well region adjacent to the first ECO base cell in one of the first direction or a second direction perpendicular to the first direction, and placing third through fifth ECO base cells in the first n-well region adjacent to the first through third ECO base cells in the other of the first or second direction. In some embodiments, the method includes configuring the first ECO base cell as a functional ECO cell and routing a plurality of electrical signal paths to the functional ECO cell.

In some embodiments, an EDA system includes a processor and a non-transitory, computer readable storage medium including computer program code for one or more programs, the non-transitory, computer readable storage medium and the computer program code being configured to, with the processor, cause the processor to position a first tap via region in a second n-well region of first through third n-well regions of an IC layout diagram, the first n-well region being separated from each of the second and third n-well regions along a first direction by at least a distance corresponding to a minimum n-well spacing rule, position a second tap via region in the third n-well region, place a first ECO base cell in the first n-well region, overlap each of the first and second tap via regions with a first metal region extending across the first n-well region in the first direction, thereby establishing a first electrical connection between the second and third n-well regions, route a first voltage distribution path to the first electrical connection, the first voltage distribution path being configured to distribute a first voltage level, and store the IC layout diagram in a storage device. In some embodiments, the non-transitory, computer readable storage medium and the computer program code are configured to, with the processor, further cause the processor to position third and fourth tap via regions in the first n-well region, overlap each of the third and fourth tap via regions with a second metal region extending across the first ECO base cell in the first direction, thereby establishing a second electrical connection between the third and fourth tap via regions, and route a second voltage distribution path to the second electrical connection, the second voltage distribution path being configured to distribute a second voltage level separate from the first voltage level. In some embodiments, the non-transitory, computer readable storage medium and the computer program code are configured to, with the processor, further cause the processor to position third and fourth tap via regions in the first n-well region and overlap each of the third and fourth tap via regions with the first metal region, thereby establishing the first electrical connection between each of the second and third n-well regions and the first n-well region. In some embodiments, the non-transitory, computer readable storage medium and the computer program code are configured to, with the processor, further cause the processor to configure the first ECO base cell as a functional ECO cell and route a plurality of electrical signal paths to the functional ECO cell. In some embodiments, the first ECO base cell is a first ECO base cell of a plurality of ECO base cells, and the non-transitory, computer readable storage medium and the computer program code are configured to, with the processor, further cause the processor to place the plurality of ECO base cells including the first ECO base cell in the first n-well region of the IC layout diagram.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure comprising:

first through third n-wells aligned along a first direction in a semiconductor substrate, wherein the first n-well is separated from each of the second and third n-wells by corresponding spaces;

a first plurality of active areas, gate structures, and metal-like defined (MD) segments overlying and electrically connected to the active areas positioned in the first n-well;

a first tap structure overlying and electrically connected to the second n-well;

a second tap structure overlying and electrically connected to the third n-well; and a first metal segment extending in the first direction, overlying the first plurality of active areas, gate structures, and MD segments, and electrically connected to each of the first and second tap structures.

2. The IC structure of claim 1, further comprising:

third and fourth tap structures overlying and electrically connected to the first n-well; and a second metal segment extending in the first direction, wherein the second metal segment overlies and is electrically connected to each of the third and fourth tap structures, and is electrically isolated from the first metal segment.

3. The IC structure of claim 2, wherein the first metal segment is configured to have a first voltage level, and the second metal segment is configured to have a second voltage level different from the first voltage level.

4. The IC structure of claim 1, further comprising:

third and fourth tap structures overlying and electrically connected to the first n-well, wherein the first metal segment is electrically connected to each of the third and fourth tap structures.

5. The IC structure of claim 1, wherein the first plurality of active areas, gate structures, and MD segments comprises a first pattern, and the IC structure further comprises a second plurality of active areas, gate structures, and MD segments overlying and electrically connected to the active areas positioned in the first n-well and comprising the first pattern.

6. The IC structure of claim 1, wherein the first plurality of active areas, gate structures, and MD segments comprises a first pattern, the IC structure further comprises a second plurality of active areas, gate structures, and MD segments overlying and electrically connected to the active areas positioned in the first n-well and comprising a second pattern, and the second pattern is symmetrical to the first pattern about a first axis perpendicular to the first direction.

7. The IC structure of claim 6, further comprising:

third and fourth pluralities of active areas, gate structures, and MD segments overlying and electrically connected to the active areas positioned in the first n-well and comprising respective third and fourth patterns, wherein the third and fourth patterns are symmetrical to the first and second patterns about a second axis along the first direction.

8. A method of generating an integrated circuit (IC) layout diagram, the method comprising:

aligning first through third n-well regions along a first direction in the IC layout diagram, wherein the first n-well region is separated from each of the second and third n-well regions by at least a distance corresponding to a minimum n-well spacing rule;

positioning a first tap via region in the second n-well region;

positioning a second tap via region in the third n-well region;

placing a first engineering change order (ECO) base cell in the first n-well region;

establishing a first electrical connection between the second and third n-well regions by overlapping each of the first and second tap via regions with a first metal region extending across the first n-well region in the first direction; and storing the IC layout diagram in a storage device.

9. The method of claim 8, further comprising:

positioning third and fourth tap via regions in the first n-well region; and establishing a second electrical connection between the third and fourth tap via regions by overlapping each of the third and fourth tap via regions with a second metal region extending across the first ECO base cell in the first direction.

10. The method of claim 9, further comprising:

routing a first voltage distribution path to the first electrical connection; and routing a second voltage distribution path to the second electrical connection, wherein the first and second voltage distribution paths are configured to distribute separate voltage levels.

11. The method of claim 8, further comprising:

positioning third and fourth tap via regions in the first n-well region, wherein the establishing the first electrical connection comprises overlapping each of the third and fourth tap via regions with the first metal region, thereby establishing the first electrical connection between each of the second and third n-well regions and the first n-well region.

12. The method of claim 8, wherein the placing the first ECO base cell in the first n-well region further comprises placing a second ECO base cell in the first n-well region adjacent to the first ECO base cell in the first direction.

13. The method of claim 8, wherein the placing the first ECO base cell in the first n-well region further comprises:

placing a second ECO base cell in the first n-well region adjacent to the first ECO base cell in the first direction, the first and second ECO base cells being symmetrical about a border between the first and second ECO base cells; and placing third and fourth ECO base cells in the first n-well region adjacent to the first and second ECO base cells in a second direction perpendicular to the first direction, the first and third ECO base cells being symmetrical about a border between the first and third ECO base cells, and the second and fourth ECO base cells being symmetrical about a border between the second and fourth ECO base cells.

14. The method of claim 8, wherein the placing the first ECO base cell in the first n-well region further comprises:

placing second and third ECO base cells in the first n-well region adjacent to the first ECO base cell in one of the first direction or a second direction perpendicular to the first direction; and placing third through fifth ECO base cells in the first n-well region adjacent to the first through third ECO base cells in the other of the first or second direction.

15. The method of claim 8, further comprising:

configuring the first ECO base cell as a functional ECO cell; and routing a plurality of electrical signal paths to the functional ECO cell.

16. An electronic design automation (EDA) system comprising:

a processor; and a non-transitory, computer readable storage medium including computer program code for one or more programs, the non-transitory, computer readable storage medium and the computer program code being configured to, with the processor, cause the processor to:

position a first tap via region in a second n-well region of first through third n-well regions of an integrated circuit (IC) layout diagram, the first n-well region being separated from each of the second and third n-well regions along a first direction by at least a distance corresponding to a minimum n-well spacing rule;

position a second tap via region in the third n-well region;

place a first engineering change order (ECO) base cell in the first n-well region;

overlap each of the first and second tap via regions with a first metal region extending across the first n-well region in the first direction, thereby establishing a first electrical connection between the second and third n-well regions;

route a first voltage distribution path to the first electrical connection, the first voltage distribution path being configured to distribute a first voltage level; and store the IC layout diagram in a storage device.

17. The EDA system of claim 16, wherein the non-transitory, computer readable storage medium and the computer program code are configured to, with the processor, further cause the processor to:

position third and fourth tap via regions in the first n-well region;

overlap each of the third and fourth tap via regions with a second metal region extending across the first ECO base cell in the first direction, thereby establishing a second electrical connection between the third and fourth tap via regions; and route a second voltage distribution path to the second electrical connection, the second voltage distribution path being configured to distribute a second voltage level separate from the first voltage level.

18. The EDA system of claim 16, wherein the non-transitory, computer readable storage medium and the computer program code are configured to, with the processor, further cause the processor to:

position third and fourth tap via regions in the first n-well region; and overlap each of the third and fourth tap via regions with the first metal region, thereby establishing the first electrical connection between each of the second and third n-well regions and the first n-well region.

19. The EDA system of claim 16, wherein the non-transitory, computer readable storage medium and the computer program code are configured to, with the processor, further cause the processor to:

configure the first ECO base cell as a functional ECO cell; and route a plurality of electrical signal paths to the functional ECO cell.

20. The EDA system of claim 16, wherein the first ECO base cell is a first ECO base cell of a plurality of ECO base cells, and the non-transitory, computer readable storage medium and the computer program code are configured to, with the processor, further cause the processor to place the plurality of ECO base cells comprising the first ECO base cell in the first n-well region of the IC layout diagram.

* * * * *